(12) United States Patent
Bigl et al.

(10) Patent No.: US 10,306,794 B2
(45) Date of Patent: May 28, 2019

(54) ELECTRICAL CIRCUIT ARRANGEMENT HAVING A CAPACITOR WITH A HOUSING FUNCTION

(71) Applicant: Siemens Aktiengesellschaft, München (DE)

(72) Inventors: Thomas Bigl, Herzogenaurach (DE); Alexander Hensler, Fürth (DE); Stephan Neugebauer, Erlangen (DE); Stefan Pfefferlein, Heroldsberg (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 15/762,451

(22) PCT Filed: Aug. 8, 2016

(86) PCT No.: PCT/EP2016/069386
§ 371 (c)(1),
(2) Date: Mar. 22, 2018

(87) PCT Pub. No.: WO2017/050489
PCT Pub. Date: Mar. 30, 2017

(65) Prior Publication Data
US 2018/0270979 A1    Sep. 20, 2018

(30) Foreign Application Priority Data

Sep. 23, 2015  (EP) .................................. 15186521

(51) Int. Cl.
*H05K 7/00* (2006.01)
*H05K 7/14* (2006.01)
(Continued)

(52) U.S. Cl.
CPC ............. *H05K 7/1427* (2013.01); *H01G 2/08* (2013.01); *H01G 2/10* (2013.01); *H01G 4/28* (2013.01);
(Continued)

(58) Field of Classification Search
CPC ...... H05K 7/1427; H05K 1/181; H05K 1/184; H05K 2201/10015; H05K 2201/1075; H01G 2/08; H01G 2/10; H02M 7/003
(Continued)

(56) References Cited

U.S. PATENT DOCUMENTS 4,823,235 A *  4/1989  Suzuki ................. H05K 9/0039
                                                174/354
5,089,935 A *  2/1992  Ito .......................... H05K 7/209
                                                361/692

(Continued)

FOREIGN PATENT DOCUMENTS

DE      4443498 C1    2/1996
EP      2672618 A1   12/2013
(Continued)

*Primary Examiner* — Hung S. Bui
(74) *Attorney, Agent, or Firm* — Henry M. Feiereisen LLC

(57) ABSTRACT

An electrical circuit arrangement has at least one capacitor (1) and at least one other circuit part (4) electrically cooperating with the first capacitor (1). The first capacitor (1) is part of a first capacitor arrangement (2) which annularly surrounds the cavity (3). The other circuit part (4) is provided at least partially within the cavity (3) and is electrically connected to the first capacitor (1). The first capacitor arrangement (2) has fastening elements (7) by means of which the circuit arrangement can be mechanically fastened to a holding element (8).

19 Claims, 6 Drawing Sheets

(51) Int. Cl.
*H01G 4/40* (2006.01)
*H01G 9/15* (2006.01)
*H01G 4/28* (2006.01)
*H01G 4/32* (2006.01)
*H01G 9/28* (2006.01)
*H01G 2/08* (2006.01)
*H01G 2/10* (2006.01)
*H02M 7/00* (2006.01)
*H05K 1/18* (2006.01)
*H02M 5/458* (2006.01)

(52) U.S. Cl.
CPC ............. *H01G 4/32* (2013.01); *H01G 4/40* (2013.01); *H01G 9/151* (2013.01); *H01G 9/28* (2013.01); *H02M 7/003* (2013.01); *H05K 1/181* (2013.01); *H05K 7/1432* (2013.01); *H02M 5/458* (2013.01); *H05K 2201/10015* (2013.01); *H05K 2201/1075* (2013.01); *H05K 2201/10189* (2013.01)

(58) Field of Classification Search
USPC .......................................................... 361/821
See application file for complete search history.

(56) References Cited

U.S. PATENT DOCUMENTS

| | | | |
|---|---|---|---|
| 6,138,347 A * | 10/2000 | Persson | H05K 9/0039 174/365 |
| 6,501,653 B1 | 12/2002 | Landsgestell et al. | |
| 6,807,046 B2 * | 10/2004 | Reiner | H01G 4/224 361/306.1 |
| 2003/0142457 A1 * | 7/2003 | Eriksson | H01G 4/224 361/301.5 |
| 2007/0284157 A1 * | 12/2007 | Heller | H02K 7/006 180/54.1 |
| 2009/0231812 A1 | 9/2009 | Schilling | |
| 2010/0321859 A1 | 12/2010 | Hosking | |
| 2013/0320896 A1 | 12/2013 | Sevakivi et al. | |
| 2016/0104658 A1 * | 4/2016 | Bradfield | H02K 9/06 310/58 |

FOREIGN PATENT DOCUMENTS

| | | |
|---|---|---|
| JP | H0831691 A | 2/1996 |
| JP | 2002528028 A | 8/2002 |
| JP | 2012507979 A | 3/2012 |
| WO | WO 2010049764 A1 | 5/2010 |
| WO | WO 2014/205474 A1 | 12/2014 |

* cited by examiner

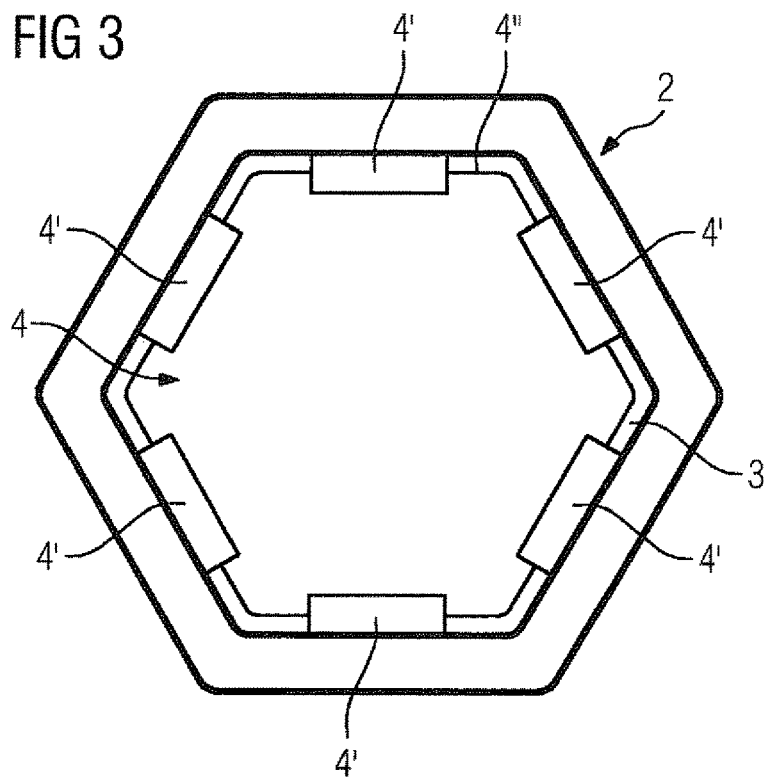
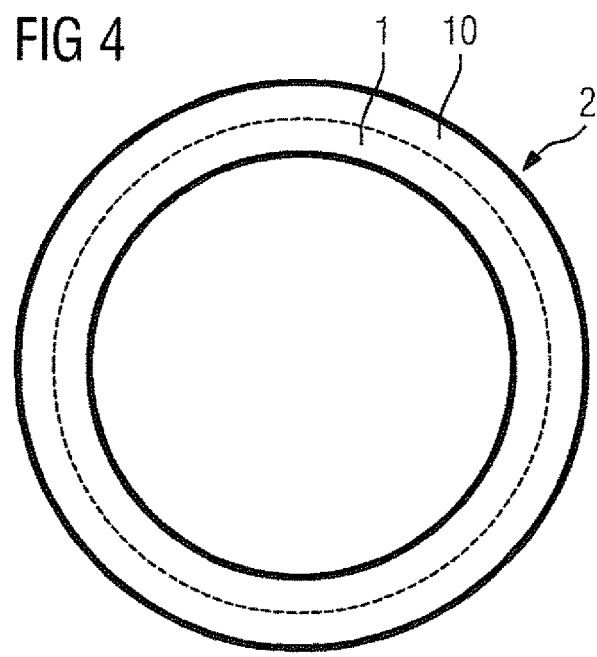

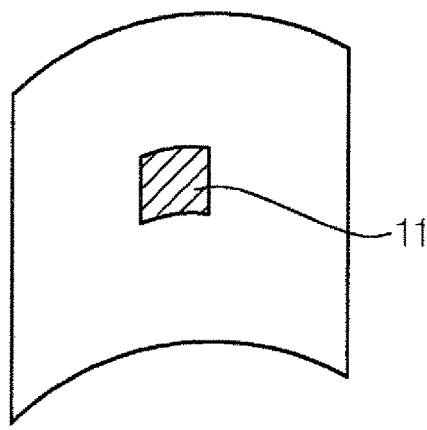
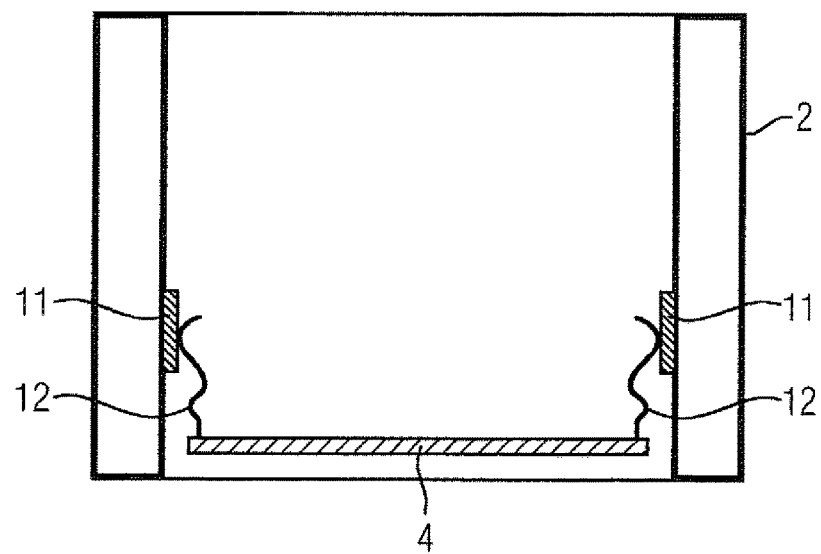

ELECTRICAL CIRCUIT ARRANGEMENT HAVING A CAPACITOR WITH A HOUSING FUNCTION

CROSS-REFERENCES TO RELATED APPLICATIONS

This application is the U.S. National Stage of International Application No. PCT/EP2016/069386, filed Aug. 16, 2016, which designated the United States and has been published as International Publication No. WO 2017/050489 and which claims the priority of European Patent Application, Serial No. 15186521.9, filed Sep. 23, 2015, pursuant to 35 U.S.C. 119(a)-(d).

BACKGROUND OF THE INVENTION

The present invention relates to an electrical circuit arrangement.

Electrical circuit arrangements are known in a variety of embodiments. In such electrical circuit arrangements, capacitors often take up a significant amount of the installation space. This applies in particular to intermediate circuit converters, which often require a large capacitance between the rectifier and the inverter.

The capacitors of the prior art can often only be integrated with difficulty into the rest of the circuit arrangement or arranged within a housing. Furthermore, the capacitors of the prior art often have to be secured against mechanical oscillation and shock loads using complicated measures. A further disadvantage is that in particular larger capacitors often cannot be arranged very close to switching elements (for instance the semiconductor switches of a rectifier or an inverter). A close arrangement would be technically advantageous, however.

In the prior art, the capacitors are in most cases installed as discrete components. They often have a cylindrical or square design and are often soldered onto flat modules or screwed to bus bars. They have to be mechanically secured using corresponding connections with the module and sometimes also with a surrounding housing or suchlike (for instance a control cabinet). The modules themselves must have adequate mechanical rigidity and stability so that they can support and secure the capacitors.

SUMMARY OF THE INVENTION

The object of the present invention consists in providing an electrical circuit arrangement which is as compact in design as possible and offers high stability.

In accordance with the invention, the object is achieved by an electrical circuit arrangement, wherein
  the circuit arrangement has at least one first capacitor and at least one further circuit part which electrically interacts with the first capacitor,
  the first capacitor is an integral part of a first capacitor arrangement, which surrounds a cavity in an annular manner,
  the further circuit part is arranged at least partially within the cavity and is electrically connected to the first capacitor and
  the first capacitor arrangement has securing elements, by means of which the circuit arrangement can be secured mechanically to a holding element,
and the electrical circuit arrangement is configured such that the first capacitor arrangement has a rated break point.

Advantageous embodiments of the inventive electrical circuit arrangement form the subject matter of the dependent claims.

The first capacitor is therefore an integral part of a first capacitor arrangement which, on account of the fact that it surrounds the further circuit part in an annular manner, can at the same time serve as a housing for the further circuit part. The first capacitor can thus, as a result, be a space-saving integral part of the housing of the electrical circuit arrangement.

The presence of the rated break point on the first capacitor arrangement can advantageously minimize damages in the event of a fault.

In the simplest case, the first capacitor arrangement forms a convex, overall curvilinear curve in the cross-section, for instance a circle (more precisely: a circular ring on account of the finite thickness of the first capacitor arrangement), an ellipse or an oval. It is alternatively possible, however, for the first capacitor arrangement to form a polygon in the cross-section. The number of corners may be between three and twelve, for instance, in particular between five and ten. In the case of a polygon the corners are preferably rounded. This is not essential, however.

The present invention can be realized particularly easily by the first capacitor being embodied as a winding capacitor. Examples of such capacitors are electrolyte capacitors or general film capacitors.

The further circuit part is preferably also held in a mechanically stable manner by the first capacitor arrangement. This produces a particularly compact design.

It is possible for the first capacitor arrangement to have no further circuit elements in addition to the first capacitor. It is alternatively possible for the first capacitor arrangement to have at least one second capacitor, preferably likewise embodied as a winding capacitor, which surrounds the first capacitor radially on the outside or rests on the first capacitor radially on the inside. It is even possible, in addition to the first and second capacitor, for even more capacitors to be present radially sequentially (in other words viewed from the cavity from the inside out, or vice versa).

In order to make contact with the first capacitor, it is possible for the first capacitor arrangement to have contact elements on its interior facing the cavity and/or on its exterior facing away from the cavity (3), by way of which contact elements the first capacitor can be electrically contacted by the further circuit part. This applies to further capacitors in the first capacitor arrangement, if present. In this case the further circuit part can have spring contacts for making electrical contact with the contact elements, for instance. The contact elements can be embodied as contact tabs, for instance. Alternatively, it is possible for the first capacitor arrangement to have contact points on its abutting surfaces, by way of which the first capacitor can be electrically contacted by the further circuit part. Provided the first capacitor arrangement also has a second capacitor in addition to the first capacitor, it is also possible for each one of the two capacitors to be contactable in the one and the other way. It is likewise possible for each one of the two connections of the first capacitor to be contactable in the one and the other way.

In the simplest case the first capacitor arrangement simply has a smooth, convex surface, for instance a cylinder casing, on its exterior. It is alternatively possible for the first capacitor arrangement to have cooling surfaces on its exterior that project radially outward. In this case, viewed in the cross-section, the first capacitor arrangement forms a concave-convex cross-section.

In a currently particularly preferred embodiment of the circuit arrangement, provision is made for
- the circuit arrangement to be embodied as an intermediate circuit converter, to which a single- or multi-phase alternating voltage is supplied by way of a rectifier and from which a single- or multi-phase alternating voltage is output by way of an inverter,
- an intermediate circuit capacitor to be arranged between the rectifier and the inverter,
- the further circuit part to comprise the rectifier and/or the inverter of the intermediate circuit converter and
- the first capacitor to be an integral part of the intermediate circuit capacitor.

It is possible for the circuit arrangement to have a second capacitor arrangement, which in turn has at least one further capacitor which electrically interacts with the circuit part. In this case, the second capacitor arrangement also surrounds the cavity in an annular manner. Furthermore, in this case the further circuit part is also electrically connected to the further capacitor. The second capacitor arrangement is in this case attached to the first capacitor arrangement and secured thereto.

For the further embodiment of the second capacitor arrangement, the above embodiments can be applied analogously to the first capacitor arrangement and the first capacitor.

BRIEF DESCRIPTION OF THE DRAWING

The afore-described properties, features and advantages of this invention as well as the manner in which they are achieved will become clearer and more comprehensible in conjunction with the following description of the exemplary embodiments, which are explained in more detail in conjunction with the drawings, which show, in a schematic representation.

DETAILED DESCRIPTION OF PREFERRED EMBODIMENTS.

Figure 1:
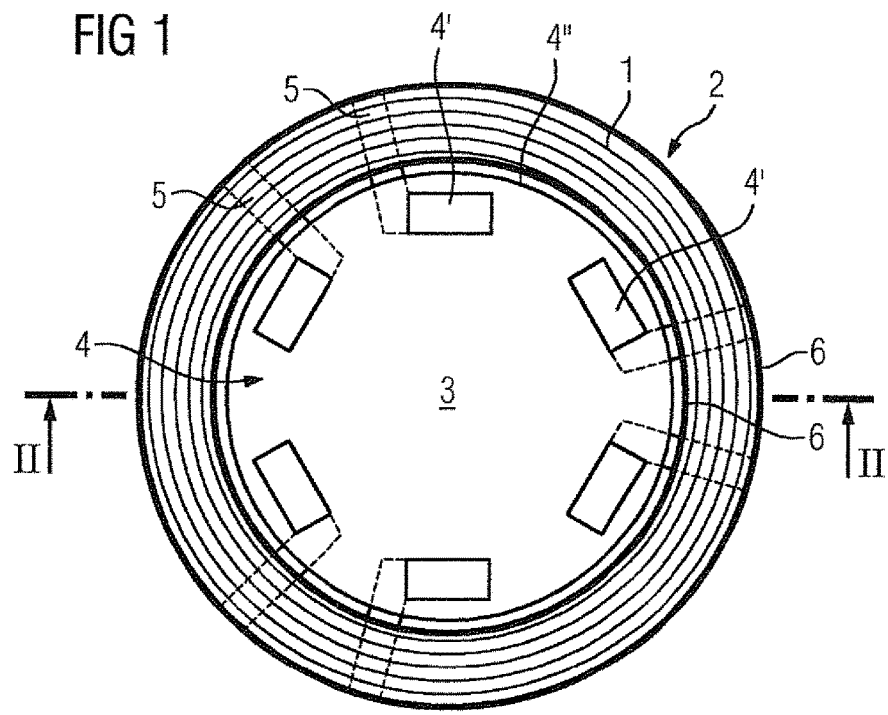
FIG. 1 a cross-section through an electrical circuit arrangement along a line I-I in FIG. 2, FIG. 2 a longitudinal section through the electrical circuit arrangement in FIG. 1 along a line II-II in FIG. 1, FIG. 3 a cross-section through a further electrical circuit arrangement, FIG. 4 a cross-section through a first capacitor arrangement, FIG. 5 a perspective detailed view of the interior of a first capacitor arrangement, FIG. 6 a cross-section through the first capacitor arrangement in FIG. 5, FIG. 7 a cross-section through a further first capacitor arrangement, FIG. 8 a cross-section through a further first capacitor arrangement, FIG. 9 a block diagram of a circuit arrangement, FIG. 10 a cross-section through a further electrical circuit arrangement and FIG. 11 a circuit arrangement with a number of capacitor arrangements.
Figure 2:
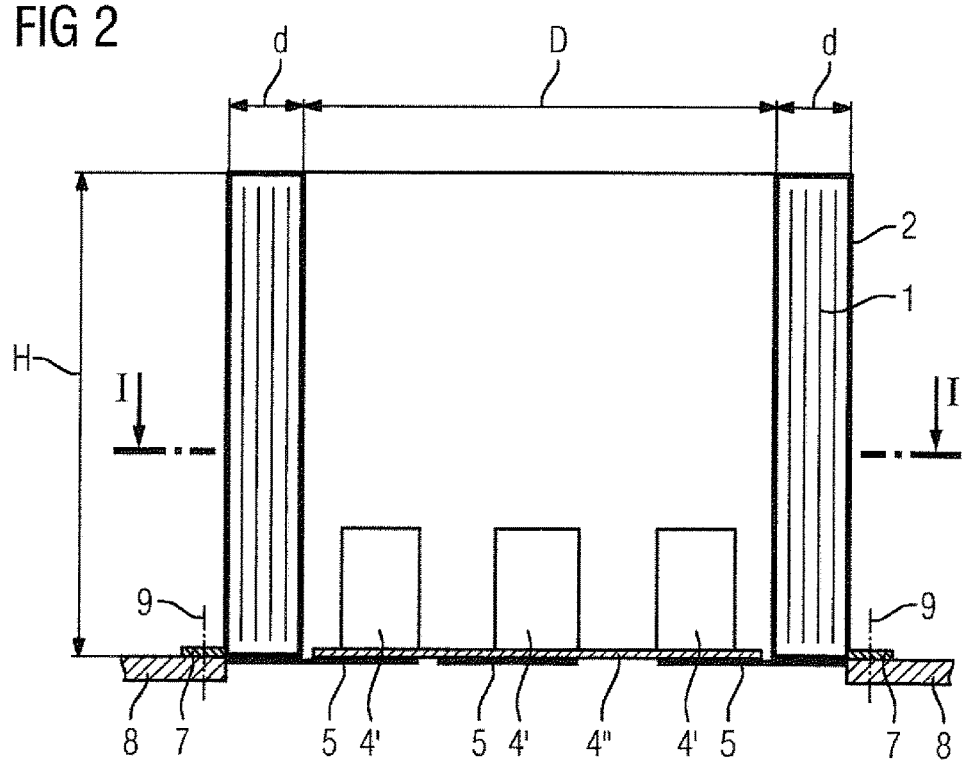

According to FIGS. 1 and 2, an electrical circuit arrangement has a first capacitor 1. The first capacitor 1 is an integral part of a first capacitor arrangement 2, which surrounds a cavity 3 in an annular manner. The first capacitor 1 is preferably embodied as a winding capacitor. Winding capacitors are generally known in particular in the form of film capacitors and electrolyte capacitors. The first capacitor arrangement 2 can have an internal diameter D, for instance, which is between 8 cm and 50 cm. The first capacitor arrangement 2 also has an installation height H, which is likewise between 8 cm and 50 cm, for instance. A wall thickness d is generally at least 5 mm and may be up to 3 cm. In individual cases, it is possible to deviate from these values, however.

At least one further circuit part 4 is arranged, at least partially, within the cavity 3. The further circuit part 4 is preferably, but not necessarily, assembled in a radial symmetrical manner or viewed in the peripheral direction has at least a certain periodicity.

The at least one further circuit part 4 electrically interacts with the first capacitor 1. The further circuit part 4 is preferably held in a mechanically stable manner by the first capacitor arrangement 2. The further circuit part 4 is also electrically connected to the first capacitor 1. As part of the embodiment according to FIG. 1, the stable support of the further circuit part 4 on the first capacitor arrangement 2 and the electrical connection with the first capacitor 1 are effected by contact tabs 5, which on one side are connected mechanically to a wall 6 of the first capacitor arrangement 2 and on the other side are connected electrically with the first capacitor 1. In particular, electrical and electronic components 4', which are arranged on a circuit carrier 4", can be electrically connected (soldered, for instance) directly to the contact tabs 5. The circuit carrier 4" in this case, where required, can support further components (not shown) and/or establish connections between the other components 4'.

Other embodiments are also possible in order to establish the mechanical support on the first capacitor arrangement 2 and the electrical connection with the first capacitor 1. For instance, the connection between the contact tabs 5 and the first capacitor 1 may be sufficient also to effect the mechanical support of the further circuit part 4.

The first capacitor arrangement 2 also has securing elements 7. The securing elements 7 can also be used to secure the first capacitor arrangement 2 and with it preferably at the same time also the electrical circuit arrangement as a whole mechanically to a holding element 8. The securing process can be carried out for instance by way of screw connections 9 indicated schematically in FIG. 2.

According to the embodiment in FIGS. 1 and 2, the first capacitor arrangement 2 is embodied as a hollow cylinder. Generally speaking the first capacitor arrangement 2 forms a convex, overall curvilinear curve in the cross-section. An ellipse or an oval are alternatives to a circle, for instance. These embodiments offer advantages in the manufacturing process. Alternatively, the first capacitor arrangement can form a polygon in the cross-section according to the representation in FIG. 3. In some instances this embodiment can be advantageous in that the components 4' can lie flat on the wall 4. This is in contrast to the embodiment of the first capacitor arrangement 2 as a hollow cylinder or similar overall curved structure. With these embodiments, in some instances the curvature of the first capacitor arrangement 2 on its interior can, according to the representation in FIG. 1, cause the components 4' only to make contact with the wall 6 at their edges. The flat contact may also be advantageous for instance also for a cooling of the components 4'. Other contacts, for instance through the use of soldering and adhesives, can also be simpler to realize.

If the first capacitor arrangement 2 forms a polygon in the cross-section, the corners of the polygon are preferably rounded. This offers particular advantages in the manufacturing process compared with sharp edges. This embodiment may also be advantageous for design reasons. Furthermore, in the case of the embodiment as a polygon, the number of corners preferably lies between three and twelve, in particular between five and ten. For instance, it may be six according to the representation in FIG. 3.

FIGS. 1 to 3 show the simplest embodiment, in which the first capacitor arrangement 2 contains no further capacitor in addition to the first capacitor 1. It is likewise possible however, according to the representation in FIG. 4, for the first capacitor arrangement 2 to have a further capacitor 10, which surrounds the first capacitor 1 radially on the outside. The further capacitor 10 will subsequently be referred to as a second capacitor 10. The second capacitor 10 is also embodied, at least preferably, as a winding capacitor. Furthermore, the first capacitor arrangement 2—which is shown neither in FIG. 4 nor in the further Figures, can also comprise even more capacitors. In this case the capacitors follow one another radially sequentially (in other words viewed from the cavity from the inside outwards or vice versa).

In order for the further circuit part 4 to make contact with the first capacitor 1 (and possibly the further capacitors 10 of the first capacitor arrangement 2), various embodiments are possible. In conjunction with FIGS. 1 and 2, an embodiment has already been explained, in which for this purpose the contact tabs 5 are present. Alternatively, the first capacitor arrangement 2 according to the representation in FIGS. 5 and 6 can have contact elements 11 on its interior facing the cavity 3. The contact elements 11 can be embodied as contact tabs, for instance. A single contact element 11 and two contact elements 11 are shown in FIG. 5 and FIG. 6 respectively. In this case, in other words if contact elements 11 are present, the first capacitor 1 can be electrically contacted by the further circuit part 4 by way of the contact elements 11. For instance, the further circuit part 4 (which is not shown in FIG. 5, and is only indicated schematically in FIG. 6) can have spring contacts 12, which are pressed against the contact elements 11 and as a result make electrical contact with the contact elements 11. In some instances, the contact elements 11 can be arranged recessed in the wall 6 or surrounded by a peripheral edge. In these two cases, depending on the spring force of the spring contacts 12, a sufficiently stable mechanical connection of the further circuit part 4 can also be achieved by means of the spring contacts 12.

Figure 7:
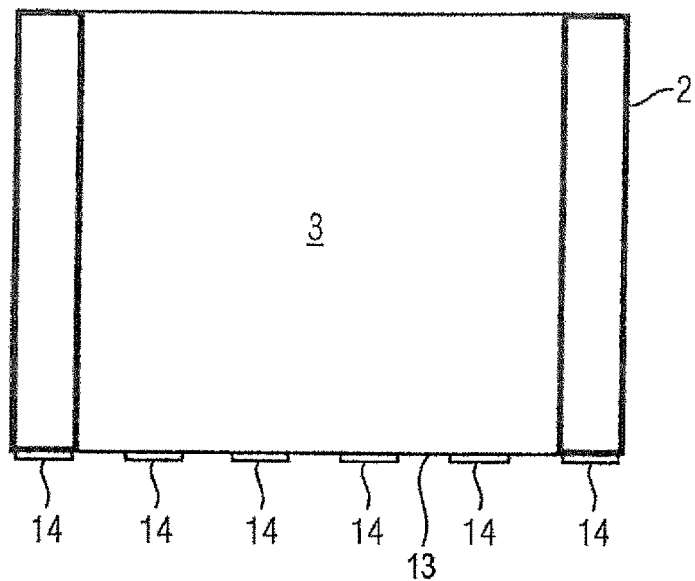

Similarly, it is possible according to the representation in FIG. 7 for the first capacitor arrangement 2 to have contact points 14 on its abutting surfaces 13. In this case, the first capacitor 1 can be electrically contacted by the further circuit part 4 by way of the contact points 14. The contact points 14 can pass into the contact tabs 5 already mentioned in conjunction with FIGS. 1 and 2. It is also possible for the first capacitor arrangement 2 to have connector pins and/or female connectors on its abutting surfaces 13 for receiving connector pins. Other embodiments are also possible.

Figure 8:
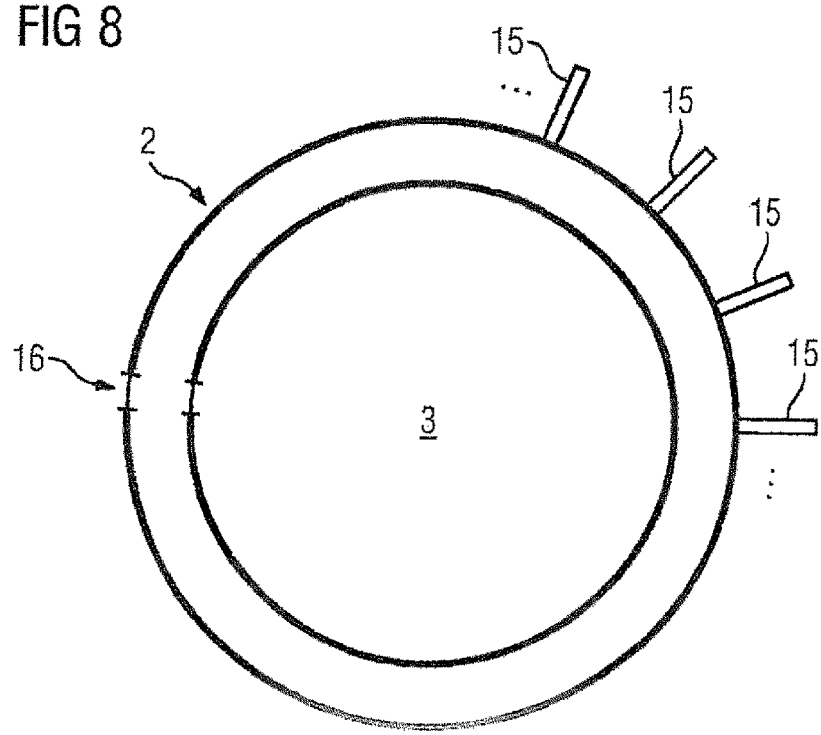

FIG. 8 shows two further embodiments of the first capacitor arrangement 2. These two embodiments can be realized independently of one another. Furthermore, these two embodiments can be realized with any of the previously explained embodiments.

According to FIG. 8, the first capacitor arrangement 2 has cooling surfaces 15 on its exterior. The cooling surfaces 15 project radially outward, in other words away from the first capacitor arrangement 2. Here, the direction in which the cooling surfaces 15 extend can have a slight tangential component (in other words around the first capacitor arrangement 2) and/or a slight axial component. The first capacitor arrangement 2 has a concave-convex contour, viewed in the cross-section, on account of the cooling surfaces 15. This is in contrast to an embodiment without cooling surfaces. In this case, viewed in the cross-section, the first capacitor arrangement 2 would have a purely convex contour. Furthermore, the first capacitor arrangement 2 according to FIG. 8 has a rated break point 16.

Figure 9:
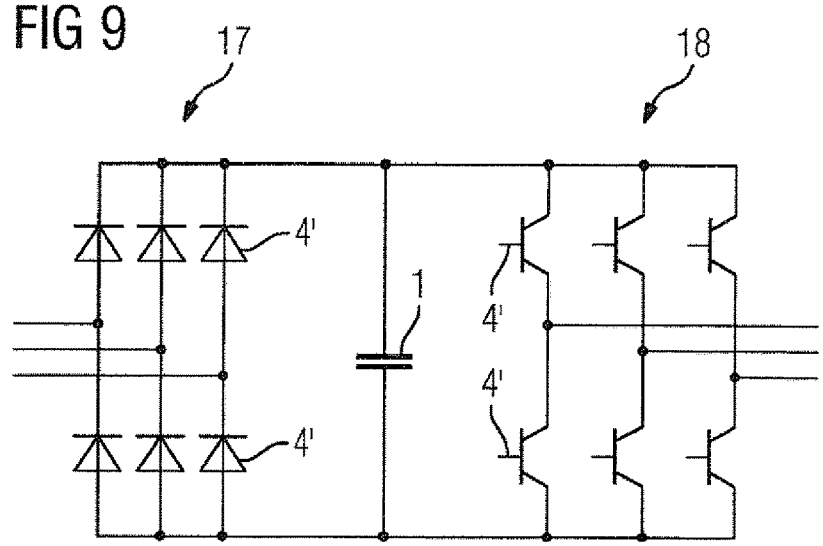

From a functional-electrical perspective, the circuit arrangement can be embodied as required. For instance, the circuit arrangement can be embodied as an intermediate circuit converter according to the representation in FIG. 9. An alternating voltage is in this case supplied to the intermediate circuit converter by way of a rectifier 17. The supplied alternating voltage can be multi-phase according to the representation in FIG. 9. Alternatively, it can be a single-phase alternating voltage. The rectifier 17 can alternatively be an uncontrolled rectifier (diode rectifier) or a controlled and therefore regenerative rectifier. An alternating voltage is also output by the intermediate circuit converter by way of an inverter 18. The output alternating voltage, similarly to the supplied alternating voltage, can be multi-phase according to the representation in FIG. 9. Alternatively, it can be a single-phase alternating voltage. An intermediate circuit capacitor 19 is further arranged between the rectifier 17 and the inverter 18, as is standard practice.

The further circuit part 4 can comprise the rectifier 17, in particular. Alternatively the further circuit part 4 can comprise the inverter 18. The further circuit part 4 can also comprise both the rectifier 17 and also the inverter 18. In particular, the components 4' of the further circuit part 4 can correspond to the semiconductor switches of the rectifier 17 and/or the inverter 18. The first capacitor 1 in turn may be in particular the intermediate circuit capacitor or an integral part of the intermediate circuit capacitor.

In particular, in the case of an intermediate circuit converter, an embodiment of the first capacitor arrangement 2 as a polygon with three, four, five, six, eight, ten or twelve corners is suitable.

An embodiment (not shown in the Figures) with three corners is suitable for instance if both the supplied and also the output alternating voltage are three-phase, and a full bridge rectification and a full bridge alternation take place. In this case, two further circuit parts 4 may be present, for instance, of which each one comprises the rectifier 17 and the inverter 18 and two semiconductor switches are arranged on each side of the polygon in each case. In this case the two circuit parts 4 are arranged in different planes in the cavity 3. Alternatively, four semiconductor switches can be arranged in a single plane on each side of the polygon.

Figure 10:
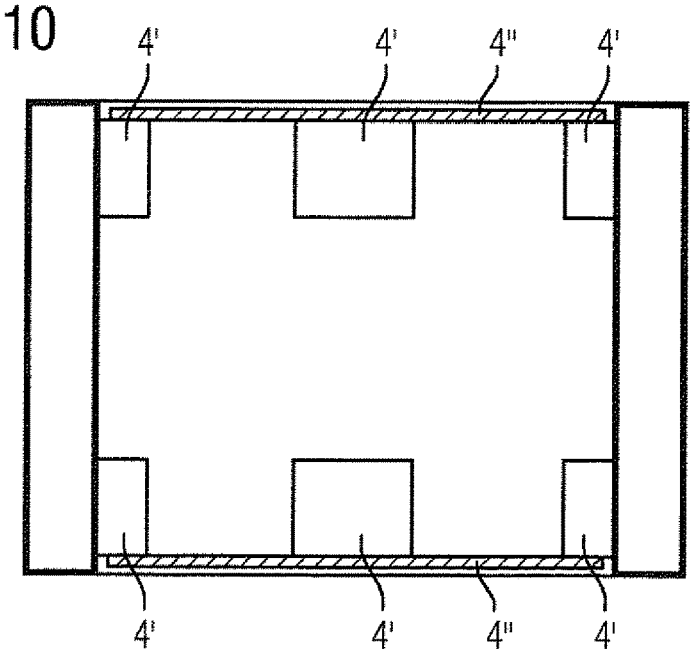

An embodiment with four corners is suitable for instance if both the supplied and also the output alternating voltage are single-phase, and a full bridge rectification and a full bridge alternation take place. In this case, two further circuit parts 4 may be present, for instance, of which each one comprises the rectifier 17 and the inverter 18. In this case the two circuit parts 4 are arranged in different planes in the cavity 3, as indicated schematically in FIG. 10. Alternatively, two semiconductor switches can be arranged in a single plane on each side of the polygon.

An embodiment with five corners offers is suitable for instance if the supplied alternating voltage is single-phase, the output alternating voltage is three-phase, and a full bridge rectification and a full bridge alternation take place. In this case, two further circuit parts 4 may be present, for instance, of which each one comprises two semiconductor switches of the rectifier 17 and three semiconductor switches of the inverter 18. In this case the two circuit parts 4 are arranged in different planes in the cavity 3, similar to FIG. 10. An analogous embodiment is possible if conversely the supplied alternating voltage is three-phase, the output alternating voltage is single-phase and a full bridge rectification and a full bridge alternation take place. Alternatively, two semiconductor switches can be arranged in a single plane on each side of the polygon.

An embodiment with six corners is suitable for instance if both the supplied and also the output alternating voltage are three-phase, and a full bridge rectification and a full bridge alternation take place. In this case, two further circuit parts 4 may be present, for instance, of which each one comprises the rectifier 17 and the inverter 18. In this case the two circuit parts 4 are arranged in different planes in the cavity 3, similar to FIG. 10. Alternatively, two semiconductor switches can be arranged in a single plane on each side of the polygon.

An embodiment with eight corners is suitable for instance if both the supplied and also the output alternating voltage are single-phase, and a full bridge rectification and a full bridge alternation take place. In this case, a single circuit part 4 may be present, for instance, which comprises both the rectifier 17 and also the inverter 18. In this case the circuit part 4 is arranged in a single plane of the cavity 3, similar to the representation in FIG. 2.

An embodiment with ten corners is suitable for instance if the supplied alternating voltage is single-phase, the output alternating voltage is three-phase, and a full bridge rectification and a full bridge alternation take place. In this case, a single circuit part 4 may be present, for instance, which comprises both the rectifier 17 and also the inverter 18. In this case the circuit part 4 is arranged in a single plane in the cavity 3, similar to the representation in FIG. 2. An analogous embodiment is possible if conversely the supplied alternating voltage is three-phase, the output alternating voltage is single-phase and a full bridge rectification and a full bridge alternation take place.

An embodiment with twelve corners is suitable for instance if both the supplied and also the output alternating voltage are three-phase, and a full bridge rectification and a full bridge alternation take place. In this case, a single circuit part 4 may be present, for instance, which comprises both the rectifier 17 and the inverter 18. In this case the circuit part 4 is arranged in a single plane in the cavity 3, similar to the representation in FIG. 2.

Figure 11:
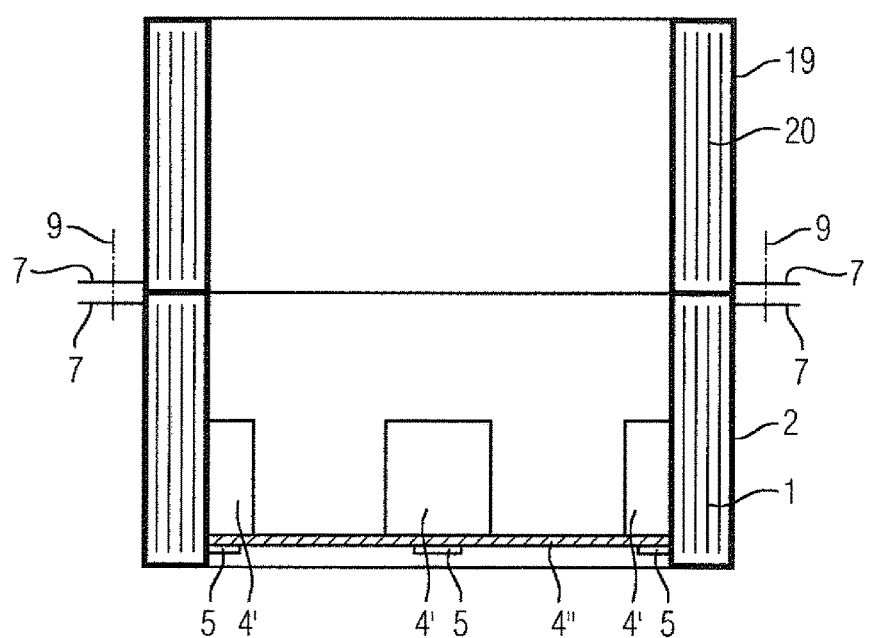

In conjunction with FIG. 4, it has been explained that a single capacitor arrangement, namely the first capacitor arrangement 2, can have a number of capacitors 1, 10. Similarly, it is possible according to the representation in FIG. 11, for the electrical circuit arrangement to have a second capacitor arrangement 19, in addition to the first capacitor arrangement 2. The second capacitor arrangement 19 in turn also has at least one capacitor 20 referred to below as the further capacitor 20. The further capacitor 20 also electrically interacts with the circuit part 4. For this purpose, the further circuit part 4 is also electrically connected with the further capacitor 20. The connection with the further capacitor 20 can be realized either directly or indirectly by way of the first capacitor arrangement 2. Furthermore, the second capacitor arrangement 19 also surrounds the cavity 3 in an annular manner. In particular, the second capacitor arrangement 19 is attached to the first capacitor arrangement 2 according to the representation in FIG. 11 and is secured thereto.

With respect to the further embodiment of the second capacitor arrangement 19 and the further capacitor 20, the same embodiments are possible, which have been explained above with respect to the first capacitor arrangement 2 and the first capacitor 1.

In summary, the present invention thus relates to the following subject:

An electrical circuit arrangement has at least one first capacitor 1 and at least one further circuit part 4 which electrically interacts with the first capacitor 1. The first capacitor 1 is an integral part of a first capacitor arrangement 2, which surrounds a cavity 3 in an annular manner. The further circuit part 4 is arranged at least partially within the cavity 3 and is electrically connected with the first capacitor 1. The first capacitor arrangement 2 has securing elements 7, by means of which the circuit arrangement can be secured mechanically to a holding element 8.

The present invention has many advantages. The first capacitor 1 can be arranged very close to the components 4'. A wire length can therefore be minimized. As a result, low intrinsic inductances of connecting wires are also produced at the same time. This applies analogously also to the second capacitors 10 and the capacitors 20 of the second capacitor arrangement 19. High capacitances can be realized within close proximity to switching elements (components 4'). The first capacitor arrangement 2 can be easily manufactured using a winding technique. By integrating the housing function into the first capacitor arrangement 2 (and possibly further capacitor arrangements 19), additional components and therefore costs and installation space can be saved. Due to the large surface of the first capacitor arrangement 2, this can be effectively cooled. Due to the large capacitance which can be achieved with a single capacitor, the first capacitor 1, many single capacitors with a smaller capacitance and their connections can be omitted. The first capacitor arrangement 2 has a high inherent stability and is as a result able to mechanically hold and support the further circuit part 4. The provision of a rated break point 16 allows the surroundings of the circuit arrangement or the circuit arrangement itself to be protected in a targeted manner against the risk of a fault in the first capacitor 1 (or another capacitor 10 in the capacitor arrangement 2). The inventive embodiment also simultaneously improves the EMC properties of the circuit arrangement. Where required, a number of capacitor arrangements 1, 19, optionally also with different installation shape, size and capacitance, can also be electrically and mechanically coupled. The installation size and the capacitance can therefore be scaled as required. It is even possible to connect the capacitor arrangements 1, 19 exclusively mechanically with one another so that capacitors 1, 10, 20 which can be connected independently of one another are available.

Although the invention has been illustrated and described in greater detail by the preferred exemplary embodiment, the invention is not limited by the examples disclosed and the person skilled in the art will be able to derive other variations without departing from the scope of protection of the invention.

What is claimed is:

1. An electrical circuit arrangement, comprising:
a first capacitor arrangement including a first capacitor configured to surround a cavity in an annular manner, and a securing element for mechanically securing the circuit arrangement to a separate holding element;
a circuit part held in a mechanically stable manner by the first capacitor arrangement and arranged at least partially within the cavity, said circuit part being electrically connected to the first capacitor and including a circuit carrier, on which electrical and/or electronic components are arranged, said first capacitor arrangement including a contact element arranged on an interior facing the cavity or on an exterior facing away from the cavity for making electrical contact of the first capacitor with the circuit part, said circuit part including a spring contact configured so as to be pressable against the contact element and thereby make electrical contact with the contact element.

2. The circuit arrangement of claim 1, wherein the first capacitor arrangement forms a convex, overall curvilinear curve in cross-section, such as a configuration in the shape of a circle, an ellipse or an oval.

3. The circuit arrangement of claim 1, wherein the first capacitor arrangement forms a polygon in cross-section.

4. The circuit arrangement of claim 1, wherein the polygon has a number of corners between three and twelve, in particular between five and ten.

5. The circuit arrangement of claim 1, wherein the first capacitor is embodied as a winding capacitor.

6. The circuit arrangement of claim 1, wherein the first capacitor arrangement includes a second capacitor, preferably embodied as a winding capacitor and arranged in radially surrounding relationship to the first capacitor or configured to rest on the first capacitor radially on an inside.

7. The circuit arrangement of claim 1, wherein the first capacitor arrangement has an abutting surface and includes a contact point on the abutting surface for electrically contacting the first capacitor by the circuit part.

8. The circuit arrangement of claim 1, wherein the first capacitor arrangement has an exterior formed with a cooling surface that projects radially outward.

9. The circuit arrangement of claim 1, wherein the first capacitor arrangement has a rated break point.

10. The circuit arrangement of claim 1, embodied as an intermediate circuit converter, to which a single- or multi-phase alternating voltage is supplied by way of a rectifier and from which a single- or multi-phase alternating voltage is output by way of an inverter, and further comprising an intermediate circuit capacitor arranged between the rectifier and the inverter, wherein the circuit part comprises at least one of the rectifier and the inverter of the intermediate circuit converter, with the first capacitor being an integral part of the intermediate circuit capacitor.

11. The circuit arrangement of claim 1, further comprising a second capacitor arrangement attached to the first capacitor arrangement and secured hereto, said second capacitor arrangement surrounding the cavity in an annular manner and including a first capacitor which interacts electrically with the circuit part, said circuit part being electrically connected to the first capacitor of the second capacitor arrangement.

12. The circuit arrangement of claim 11, wherein the second capacitor arrangement forms a convex, overall curvilinear curve in cross-section such as a configuration in the shape of a circle, an ellipse or an oval.

13. The circuit arrangement of claim 11, wherein the second capacitor arrangement forms a polygon in cross-section.

14. The circuit arrangement of claim 13, wherein the polygon has a number of corners between three and twelve, in particular between five and ten.

15. The circuit arrangement of claim 11, wherein the first capacitor of the second capacitor arrangement is embodied as a winding capacitor.

16. The circuit arrangement of claim 11, wherein the second capacitor arrangement includes a second capacitor, preferably embodied as a winding capacitor and arranged in radially surrounding relationship to the first capacitor of the second capacitor arrangement or configured to rest on the first capacitor of the second capacitor arrangement radially on an inside.

17. The circuit arrangement of claim 11, wherein the second capacitor arrangement has an abutting surface and includes a contact point on the abutting surface for electrically contacting the first capacitor of the second capacitor arrangement by the circuit part.

18. The circuit arrangement of claim 11, wherein the second capacitor arrangement has a rated break point.

19. The circuit arrangement of claim 11, embodied as an intermediate circuit converter, to which a single- or multi-phase alternating voltage is supplied by way of a rectifier and from which a single- or multi-phase alternating voltage is output by way of an inverter, and further comprising an intermediate circuit capacitor arranged between the rectifier and the inverter, wherein the circuit part comprises at least one of the rectifier and the inverter of the intermediate circuit converter, with the first capacitor of the second capacitor arrangement being an integral part of the intermediate circuit capacitor.

* * * * *